(12) United States Patent
Dove

(10) Patent No.: US 8,609,508 B2
(45) Date of Patent: Dec. 17, 2013

(54) METHOD OF FABRICATING AN INTEGRATED CIRCUIT HAVING A STRAIN INDUCING HOLLOW TRENCH ISOLATION REGION

(75) Inventor: Barry Dove, Coppell, TX (US)

(73) Assignee: STMicroelectronics, Inc., Coppell, TX (US)

( * ) Notice: Subject to any disclaimer, the term of this patent is extended or adjusted under 35 U.S.C. 154(b) by 45 days.

(21) Appl. No.: 12/963,474

(22) Filed: Dec. 8, 2010

(65) Prior Publication Data

US 2012/0146152 A1   Jun. 14, 2012

(51) Int. Cl.
*H01L 21/76* (2006.01)
*H01L 21/70* (2006.01)
*H01L 23/58* (2006.01)

(52) U.S. Cl.
USPC .... 438/422; 257/522; 257/640; 257/E21.564; 257/E21.573

(58) Field of Classification Search
USPC ........... 257/E21.564, E21.573, E21.581, 522, 257/368, 510, 513, 640, E21.293, E29.255; 438/296, 422, 421
See application file for complete search history.

(56) References Cited

U.S. PATENT DOCUMENTS

| | | | | |
|---|---|---|---|---|
| 7,015,116 | B1* | 3/2006 | Lo et al. | 438/437 |
| 7,309,640 | B2 | 12/2007 | Martin et al. | |
| 2005/0156274 | A1* | 7/2005 | Yeo et al. | 257/510 |
| 2005/0245043 | A1* | 11/2005 | Martin et al. | 438/424 |
| 2008/0303102 | A1* | 12/2008 | Liang et al. | 257/397 |
| 2009/0140375 | A1* | 6/2009 | Kim | 257/506 |
| 2010/0109091 | A1* | 5/2010 | Griebenow et al. | 257/377 |

* cited by examiner

*Primary Examiner* — Daniel Luke
*Assistant Examiner* — Khaja Ahmad
(74) *Attorney, Agent, or Firm* — Seed IP Law Group PLLC

(57) ABSTRACT

A shallow trench isolation is formed in a semiconductor substrate adjacent a MOS transistor. The shallow trench is filled with a fill material while other processing steps are performed. The fill material is later removed through a thin well etched into layers above the trench, leaving the trench hollow. A thin strain inducing layer is then formed on the sidewall of the hollow trench. The well is then plugged, leaving the trench substantially hollow except for the thin strain inducing layer on the sidewall of the trench. The strain inducing layer is configured to induce compressive or tensile strain on a channel region of the MOS transistor and thereby to enhance conduction properties of the transistor.

14 Claims, 16 Drawing Sheets

METHOD OF FABRICATING AN INTEGRATED CIRCUIT HAVING A STRAIN INDUCING HOLLOW TRENCH ISOLATION REGION

BACKGROUND

1. Technical Field

The present disclosure relates to the field of integrated circuit design. The present disclosure relates more particularly to formation of isolation trenches in a semiconductor substrate.

2. Description of the Related Art

Integrated circuits generally include many transistors formed at the surface of a semiconductor substrate. Since the advent of integrated circuits, there has been a continuous scaling of transistor size to enable putting more transistors in a smaller area of the semiconductor substrate. This scaling has allowed integrated circuits to contain more complex circuits in a same area and thus decrease cost. Additionally, as transistors decrease in size, the switching speed increases, thus improving performance.

However, as the size of transistors has continued to shrink, so has the distance separating transistors from one another. This shrinking of the separation distance has produced undesired effects in transistor performance. In particular electric fields generated in one transistor more readily affect the performance of an adjacent transistor. This effect can degrade the performance of individual transistors and on a large scale can affect the performance of the integrated circuit as a whole. Additionally, leakage currents develop between adjacent transistors, affecting performance and using power. This extra power usage is uneconomical and also can heat the chip, further adversely affecting the chip.

To reduce these leakage currents, field oxide regions have been placed between transistor regions. The field oxide regions generally comprise a barrier of silicon oxide with a portion above and a portion below the surface of the substrate formed by local oxidation of silicon (LOCOS).

But as transistor size has further shrunk, other means of isolating adjacent transistors have arisen. In particular, shallow trench isolation (STI) has been utilized to isolate adjacent transistors from each other. In STI processing, a portion of the silicon substrate between adjacent transistors is etched to form a trench in the substrate. The trench is then filled with a dielectric material which serves to inhibit leakage currents between the adjacent transistors.

Scaling of transistor size has served to improve switching speed (the maximum speed at which a transistor can be switched off or on), conduction properties, and circuit density. However as CMOS technology has reached the 32 nm and 16 nm nodes, scaling has become more difficult and new means for improving device function have been sought.

One means for improving transistor properties is to introduce strain on the channel of the transistor. This has been done by carefully forming strain inducing layers of materials above or below the channel region of the transistor. The strain inducing layers induce either a tensile or compressive strain on the channel region of the transistor, according to the type of the transistor, and in so doing improve carrier mobility in the channel region. The improved carrier mobility enhances current conduction in the channel region, which in turn allows for lower power dissipation and enhanced transconductance. The enhanced transconductance means that a larger current can be induced in the channel with a smaller gate to source voltage, allowing for lower supply voltages to be used on chip. The lower supply voltages allow for further reduction of power dissipation.

BRIEF SUMMARY

One embodiment of the invention provides a shallow trench isolation that improves isolation between transistor regions while at the same time providing for improved carrier mobility in a channel region of a transistor. In one embodiment a shallow trench isolation between transistor regions is left substantially hollow, thus reducing a capacitance between adjacent transistors. A thin strain inducing material is deposited on sidewalls of the trench to induce a strain on the channel region of an adjacent transistor. The induced strain increases carrier mobility in the channel region and improves transistor performance.

One embodiment is an integrated circuit comprising a semiconductor substrate, a transistor having a channel region in the substrate, and an isolation trench in the substrate adjacent the transistor. A first strain inducing layer lines a wall of the isolation trench and is configured to induce strain on the channel region of the transistor. In one embodiment the isolation trench is left substantially hollow.

In one embodiment the first strain inducing layer is configured to induce a compressive strain in the channel region of a p-channel transistor. In another embodiment the first strain inducing layer is configured to induce a tensile strain in an n-channel region of the transistor.

In one embodiment the first strain inducing layer is silicon nitride. In one embodiment the first strain inducing layer comprises Ge.

In one embodiment a second strain inducing layer is above the active device and is configured to induce strain in the channel region of the transistor. The second strain inducing layer may be for example a silicon nitride capping layer. The first and the second strain inducing layers may be tuned to each induce a particular type and level of strain. This enables selection of conduction characteristics of the transistor.

One embodiment is a method comprising forming a transistor at a surface of a semiconductor substrate, forming an isolation trench in the substrate adjacent the transistor, and forming a first strain inducing layer on a sidewall of the isolation trench. The method further comprises closing an upper opening of the isolation trench. The isolation trench remains substantially hollow after the opening has been closed.

In one embodiment forming the isolation trench comprises etching the substrate. In one embodiment lining the sidewall comprises filling the isolation trench with a sacrificial material, depositing a dielectric material over the isolation trench, etching a narrow opening in the dielectric material above the isolation trench, removing the sacrificial material through the narrow opening, and depositing the first layer of strain inducing material on the sidewall of the isolation trench through the narrow opening.

In one embodiment lining the sidewall includes depositing silicon nitride on the sidewall of the isolation trench. In one embodiment the silicon nitride is deposited by LPCVD.

In one embodiment the method further comprises forming a second layer of strain inducing material over the active device. The second layer of strain inducing material is configured to induce strain on a channel region of the transistor.

DETAILED DESCRIPTION

Figure 1:
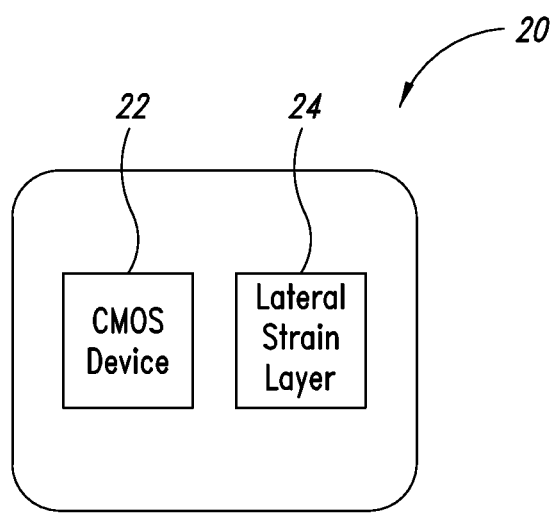
FIG. 1 is a block diagram of an integrated circuit according to one embodiment.

FIG. 1 is a block diagram of an integrated circuit according to one embodiment of the invention. The integrated circuit 20 comprises a CMOS device 22 and a lateral strain layer 24 adjacent the CMOS device 22. The lateral strain layer 24 induces a strain on the CMOS device 22 and improves device characteristics.

Biaxial strain can be induced in the channel region of a transistor by forming a lattice junction between two dissimilar materials. One example of a lattice junction between two dissimilar materials is where a layer of monocrystalline Si joins a layer of SiGe. The crystal structures of the two materials join at the interface. In the case of SiGe and Si the spacing between atoms in a SiGe crystal structure is larger than the spacing between atoms in a Si crystal structure, but the difference is small enough that the two lattices can bond. At the interface of SiGe and Si, the larger lattice spacing of the SiGe causes a biaxial tensile strain in the atoms of the Si lattice. In effect the atoms in the Si lattice are stretched apart and the lattice spacing of atoms in Si becomes slightly larger. This larger lattice spacing allows electrons in the conduction band of Si to travel more freely through the Si lattice. This improved mobility increases switching speeds and thus enhances transistor characteristics.

Uniaxial strain can be induced in the channel by forming layers of material that either pull or push in one direction on the substrate. Silicon nitride layers in particular can be formed and doped in such a way as to induce uniaxial compressive or tensile strain on a silicon substrate. Many other kinds of strain inducing materials and configurations can be utilized to enhance carrier mobility in the channel region.

In one embodiment the lateral strain layer 24 is one that laterally induces strain on a channel region of the CMOS device 22 from the side of the channel region rather than from above or below. The lateral strain layer 24 is adjacent the channel region in a lateral direction. The lateral strain layer 24 may be one that laterally abuts a source or drain region of the CMOS device 22 and imparts a strain to the source or drain region which in turn strains the channel region of the CMOS device 22.

Figures 2A, 2B:
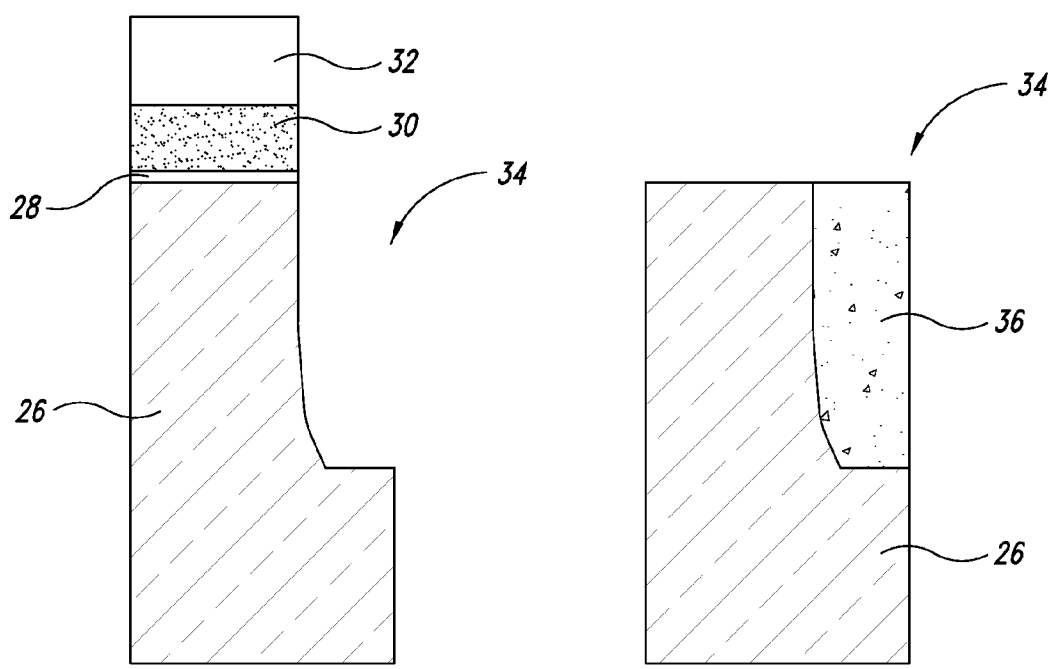
FIGS. 2A-2H are cross-sections of an integrated circuit according to one embodiment illustrating various steps of fabrication.

FIGS. 2A-2H show a process for forming an integrated circuit 20 having a CMOS device 22 and a lateral strain layer 24 according to one embodiment. In FIG. 2A a sacrificial dielectric layer 28 is formed on a semiconductor substrate 26. The layer 28 is $SiO_2$ and the substrate 26 is silicon in one example. A second sacrificial dielectric layer 30, for example of $Si_3N_4$, is then formed on the layer 28. Layers 28 and 30 may alternatively be of any other suitable materials that may be selectively etched relative to the substrate 26. The layers 28, 30 can be formed by any conventional means as are well known to those of skill in the art and are not detailed here. A masking layer 32, for example of photoresist, is deposited and photolithographically removed over a portion of substrate 26. Sacrificial layers 28 and 30 are then etched to expose a portion of substrate 26. The sacrificial dielectric layers 28, 30 may be etched by any conventional means. The exposed portion of the substrate 26 is then etched to form a shallow trench isolation region 34. In FIGS. 2A-2D only the left half of the trench is shown for ease in viewing the effect on one transistor.

As shown in FIG. 2B the trench region 34 is filled with a fill material 36. The fill material 36 is preferably one that may be etched selectively with respect to the substrate 26 and typical dielectric layers like those used for layers 28, 30. In one embodiment the fill material 36 is Ge or SiGe. It is preferred to use $Si_{1-x}Ge_x$ with relatively high germanium content ($x \geq 0.1$; preferably $0.1 \leq x \leq 0.3$) for a better etch selectivity compared with Si. The $Si_{1-x}Ge_x$ is selectively etchable relative to silicon oxides, silicon nitrides, and other dielectric layers.

After the trench 34 is filled, the excess fill 36 material above the substrate 26 is removed by etching, followed by chemical mechanical planarization ("CMP") or other suitable process to make a surface of the fill material 36 substantially even with a surface of the substrate 26 as is shown in FIG. 2B.

Figure 2C:
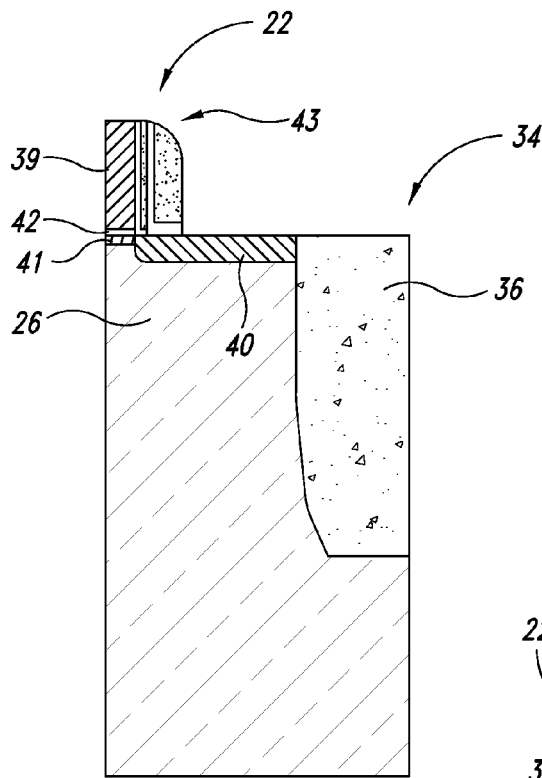

FIG. 2C shows MOS transistor 22 formed after filling of the trench 34. FIG. 2C only illustrates half of the MOS transistor 22 as well as half of trench 34 in the interest of simplicity. The MOS transistor 22 has an insulated gate 39, formed on gate oxide 42. Below the gate oxide 42 is the channel region 41. The insulated gate 39 of the MOS transistor is flanked by multi-layer sidewall spacer 43. Source/Drain region 40 is formed by one or more doping steps including LDD, or other doping processes known to those of skill in the art. The channel region 41 may also be doped, for example by HALO doping or other suitable process. However, channel region 41 may also be undoped relative to the substrate 26. The MOS transistor 22 may be formed according to any conventional process. Such processes are well known in the art and will not be detailed here.

Figure 2D:
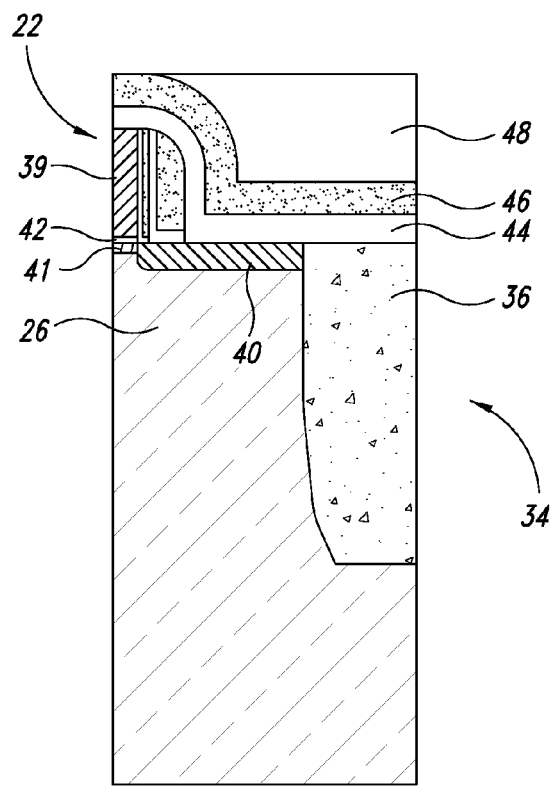

In FIG. 2D a first capping layer 44 of $SiO_2$ is formed, followed by a second capping layer 46 of $Si_3N_4$ and a third capping layer 48 of $SiO_2$. CMP is then performed to make the top surface of the third capping layer 48 substantially planar. Capping layers are commonly placed over the gate region of a transistor and are well known to those of skill in the art. In practice there may be more or fewer capping layers. The capping layers 44, 46, 48 may also be formed of other suitable dielectric layers other than those given by example above. But preferably the capping layers are selectively etchable with respect to the fill material 36.

Figure 2E:
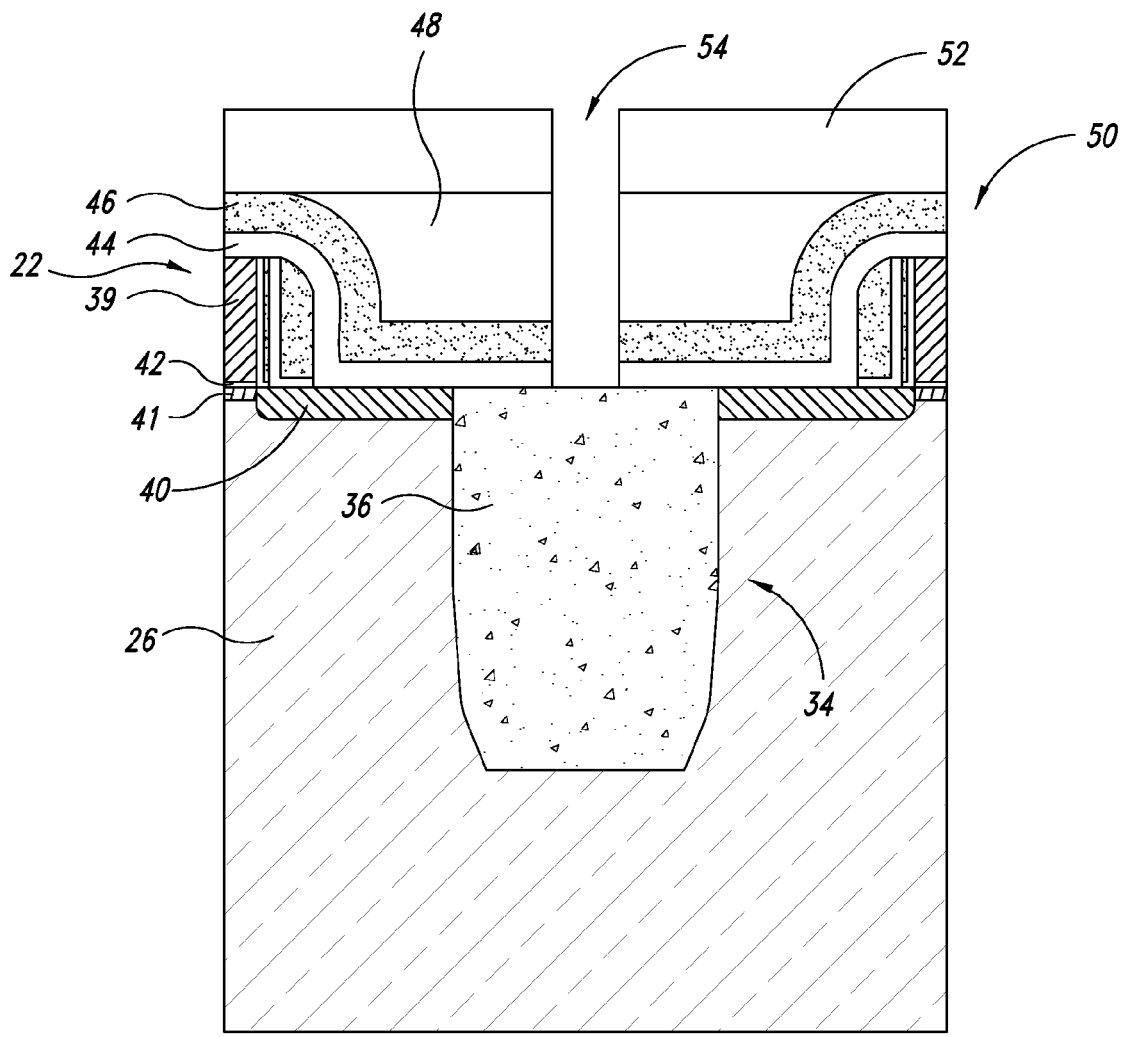

The view in FIG. 2E has been broadened to show half of a second MOS transistor 50 and all of trench 34. Masking layer 52 is deposited on the capping layer 48 and photolithographically patterned to enable etching a opening 54 in capping layers 44, 46, and 48 to expose the top surface of the fill material 36.

Once the opening 54 has been formed, the fill material 36 is selectively etched and removed from the trench 34. In one embodiment the etch is performed using an oxidizing chemical such as a solution comprising 40 ml of 70% $HNO_3$+20 ml of 0.5% HF, or by isotropic plasma etching. U.S. Pat. No. 7,309,640 further details formation of an STI region in an integrated circuit and is hereby incorporated by reference in its entirety.

Figure 2F:
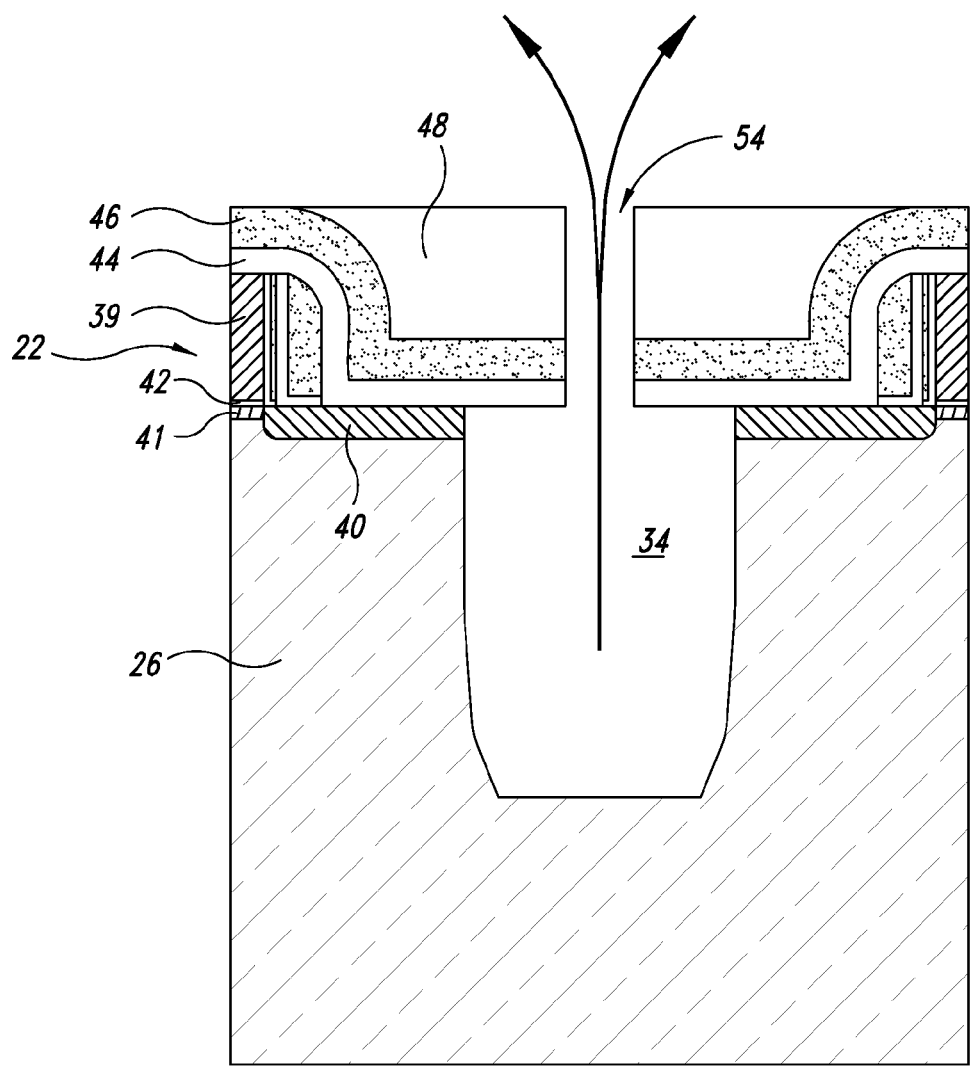

After forming the well shown in FIG. 2F, a strain inducing layer 56 is deposited on sidewalls 58 of trench 34 and on the sidewalls of the opening 54. The strain inducing layer 56 may be conformally deposited, and may exert compressive or tensile strain on the substrate 26 thereby straining channel region 41. In a preferred embodiment, $Si_3N_4$ is used for the strain inducing layer 56, but other strain inducing layers may be used, for example a thin layer of $Si_{1-x}Ge_x$ may be epitaxially grown on the sidewall 58 of trench 34. The $Si_3N_4$ strain inducing layer may be deposited by means of a low pressure chemical vapor deposition (LPCVD), plasma enhanced chemical vapor deposition (PECVD), or other suitable methods.

A silicon nitride layer 56 can have compressive or tensile strain characteristics depending on the conditions during formation of the silicon nitride. $Si_3N_4$ can be formed by PECVD in a chamber in the presence of silane ($SiH_4$), $N_2$, and ammonia ($NH_3$). By varying the silane flow rate, the ammonia flow rate, the $N_2$ flow rate, the pressure, temperature (both before and after deposition), and the low and high frequency power outputs in the deposition chamber, a silicon nitride layer can be made to have varying levels of compressive or tensile strain. Methods for forming silicon nitride layers having a selected level of strain are well known by those of skill in the art and are not further detailed here.

In some embodiments a very thin silicon oxide layer (not shown) may be formed on the sidewall 58 of trench 34 prior to formation of the strain inducing layer 56 in order to improve the adhesion and formation of the strain inducing layer 56 on the exposed sidewall 58 of trench 34, especially if the strain inducing layer 56 is silicon nitride.

Figure 2G:
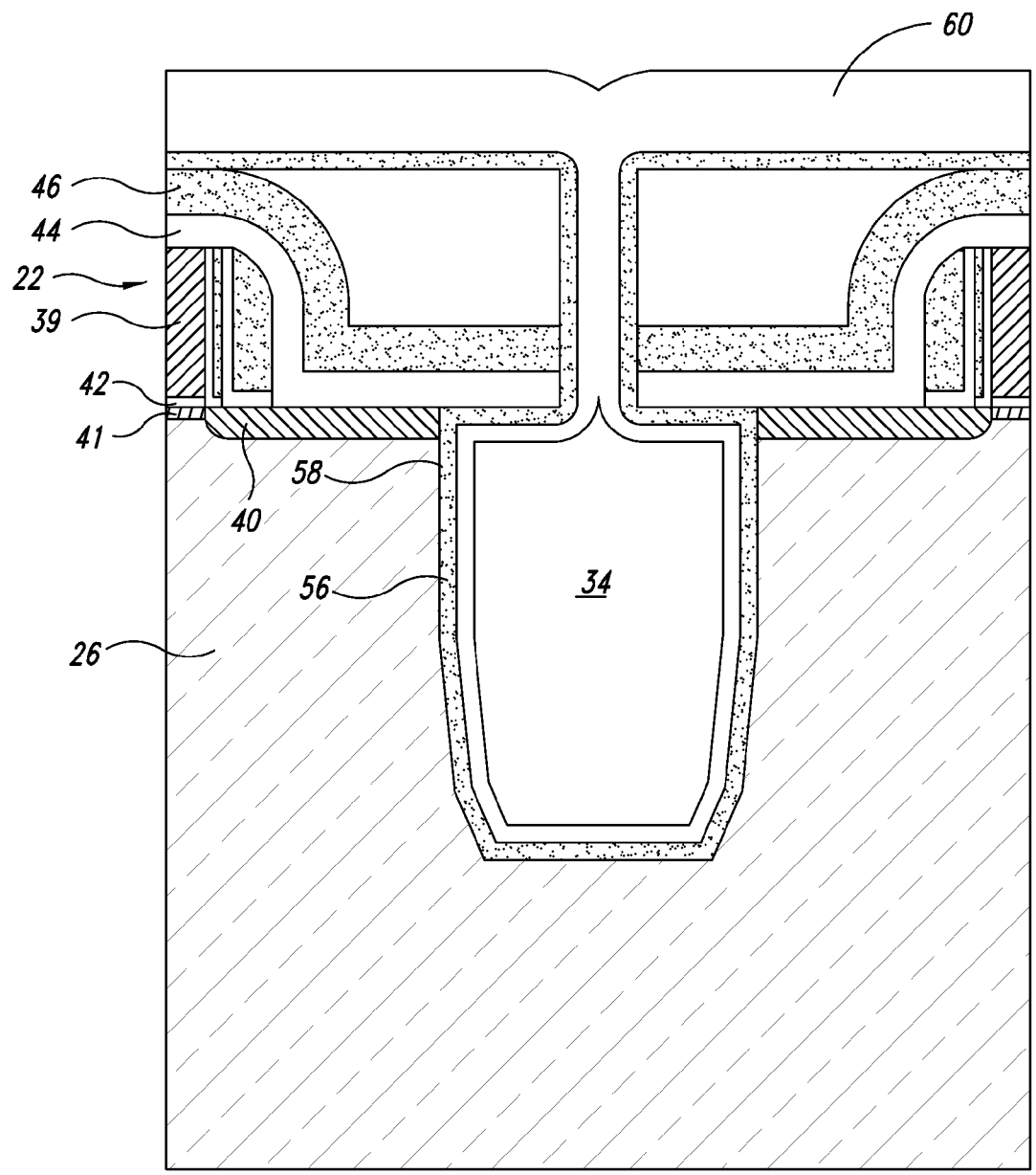

After the strain inducing layer 56 is formed to the desired thickness, an encapsulation layer 60 is deposited on the strain inducing layer 56. The encapsulation layer 60 may be conformally deposited on the strain inducing layer 56. The encapsulation layer 60 is deposited to a thickness that causes the opening 54 to be closed. The thickness of the encapsulation layer 60 on the strain inducing layer 56 will be approximately half the width of the opening 54. The trench 34 remains substantially hollow with only a thin strain inducing layer 56 and encapsulation layer 60 on the wall 58 of the trench 34 after the opening 54 has been closed. The encapsulation layer 60 may be a silicon oxide layer conformally deposited on the strain inducing layer 56. However, other suitable dielectric materials and methods of deposition may be used. Encapsulation layer 60 may be formed of a low-k dielectric material, for example carbon doped $SiO_2$, fluorine doped $SiO_2$, or porous $SiO_2$. Other low-k dielectric materials may also be used. The encapsulation layer 60 may be formed by any suitable method for depositing a dielectric on the material of layer 56 as the case may be. The encapsulation layer 60 may be conformally deposited and may partially or completely coat the strain inducing layer 56 within the hollow cavity 34 (as shown in FIG. 2G for example). However it is not necessary for encapsulation layer 60 to be conformally deposited.

Figure 2H:
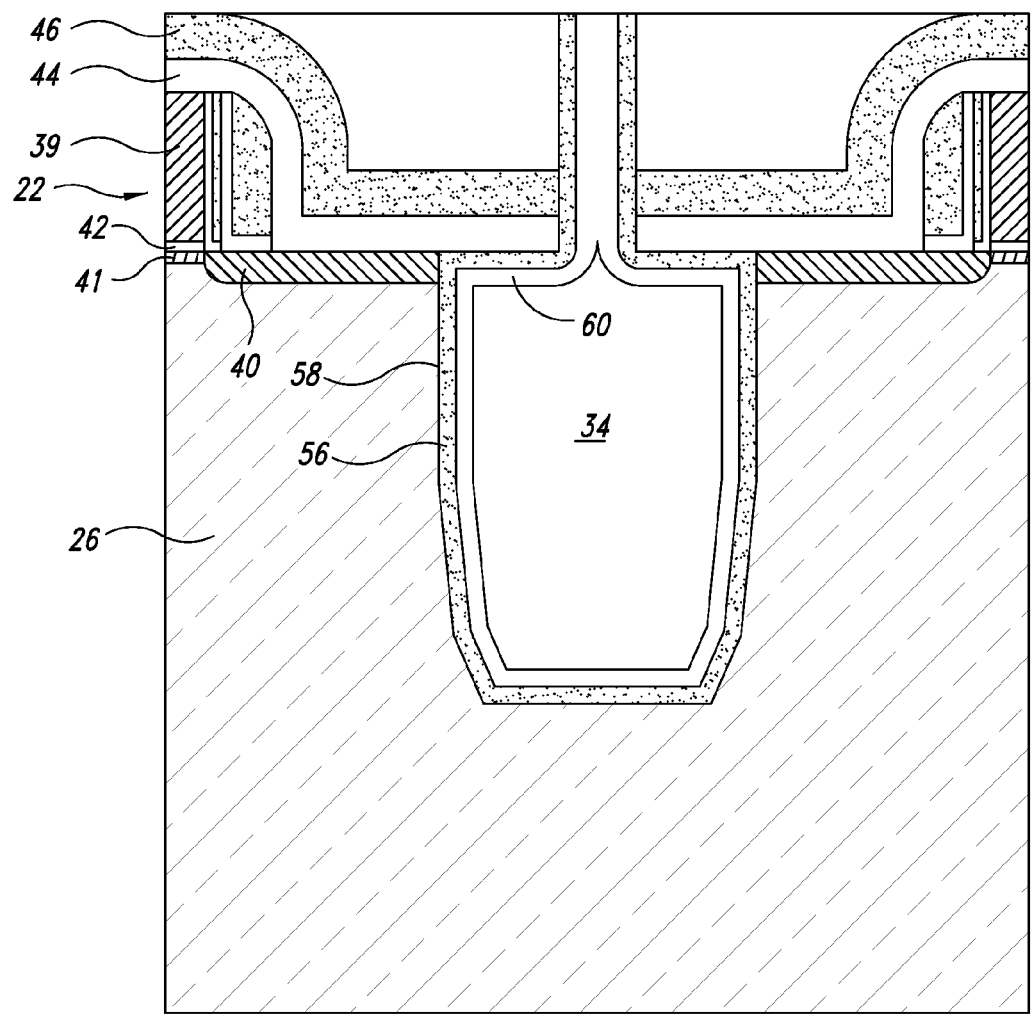

In FIG. 2H the encapsulation layer is removed above the capping layers 44, 46, 48 for example by CMP. In one embodiment the encapsulation layer 60 is a thick layer and may be left to form a portion of a pre-metal dielectric layer which is formed prior to making first metal interconnect lines of integrated circuit 20.

As disclosed in FIG. 2H, the trench 34 is substantially hollow except for thin layers 56 and 60 on the sidewalls 58. This allows the trench to perform its function of inhibiting leakage currents from flowing between adjacent transistors 22, 50 while also reducing the capacitance that may form across the trench 34 when there is a dielectric material filling the trench 34. The capacitance that forms between two conductors is proportional to the dielectric constant k of the material between the conductors. The dielectric constant k of empty space or air is 1, and is thus lower than other dielectric materials. Advantageously the trench 34 is substantially hollow and thus has a very low dielectric constant. Using a low-k dielectric material for the encapsulation layer 60 further reduces the overall capacitance of the trench.

The hollow shallow isolation trench 34 is also utilized to improve carrier mobility in the channel 41 of the transistor 22 by having a strain inducing layer 56 on a sidewall 58 of trench 34. As described above, the strain inducing layer 56 may be selected to provide tensile or compressive strain on the channel region 41 according to the carrier type of the transistor 22. In the case of a p-channel transistor, compressive strain improves the mobility of holes in the channel 41. This means that holes in the channel will more easily move from atom to atom. In an n-channel transistor, tensile strain improves carrier mobility. This means that electrons in the channel region 41 move more freely. When the strain inducing layer 56 is silicon nitride a uniaxial strain is imparted to the channel region 41 of the transistor 22. When a strain inducing layer 56 of SiGe is used, a biaxial strain is induced in the channel region 41. Other materials providing a uniaxial or biaxial strain in the channel region 41 may be used for a strain inducing layer 56.

Other types of strain inducing layers include strain inducing SiGe layers below a Si substrate on which transistors are formed and $Si_3N_4$ capping layers over the transistor, as two examples. Straining the channel region of a transistor in multiple ways can have an additive effect on the mobility of carriers in the channel. For instance, a strain layer above the channel region and a strain layer laterally adjacent the channel region can complement each other to improve carrier mobility more than either strain layer alone.

In one embodiment of the invention the capping layers 44, 46, 48 are utilized as strain inducing layers to compliment the strain inducing layer 56. For example, second capping layer 46 may be implemented as a silicon nitride layer configured to impart strain to the channel region 41 of the transistor 22. Layer 46 may be configured to impart a desired amount of compressive or tensile strain by varying the deposition conditions as described above or in other possible manners.

In one embodiment the second capping layer 46 and the strain inducing layer 56 are tuned to each impart a desired strain to the channel region 41 thereby straining the channel region 41 to achieve a desired transistor performance characteristic. Advantageously, the strain imparted by the second capping layer 46 can be the same or different from that imparted by the strain inducing layer 56.

In a further embodiment, opening 54 may be formed after formation of layer 44 but prior to formation of capping layer 46. The fill material 36 is removed through the opening 54 as described before. A strain inducing layer 56 of silicon nitride is formed on the sidewall 58 of the trench 54 and on top of capping layer 44. The strain inducing layer 56 thus replaces capping layer 46. The strain inducing layer 56 is both a lateral strain inducing layer on the sidewall 58 of the trench 34 and a capping layer over the transistor 22. Many other configurations of strain inducing layer 56 and capping layer 46 are possible in view of the present disclosure.

Figure 3A:
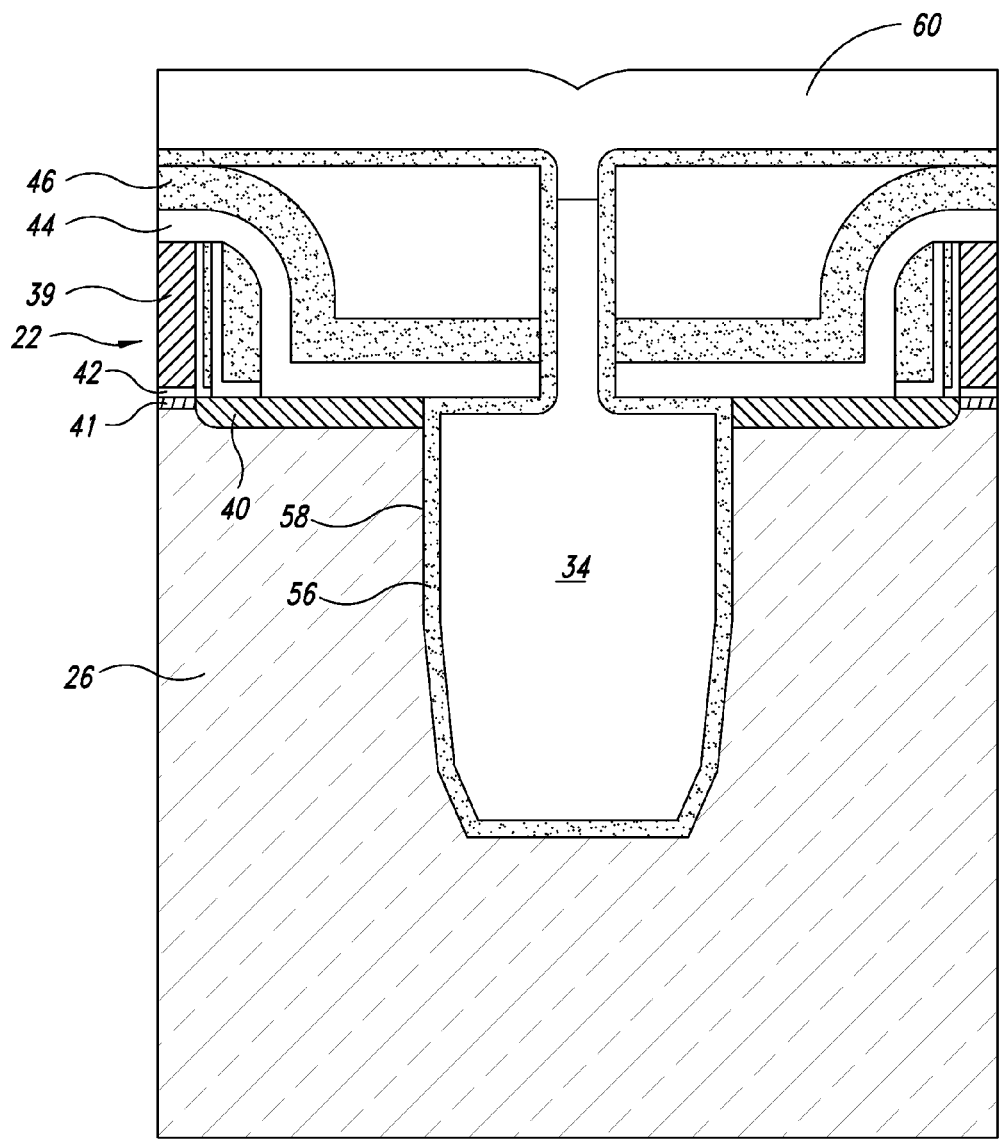
FIGS. 3A-3B are cross-sections of an integrated circuit according to one embodiment illustrating various steps of fabrication.
Figure 3B:
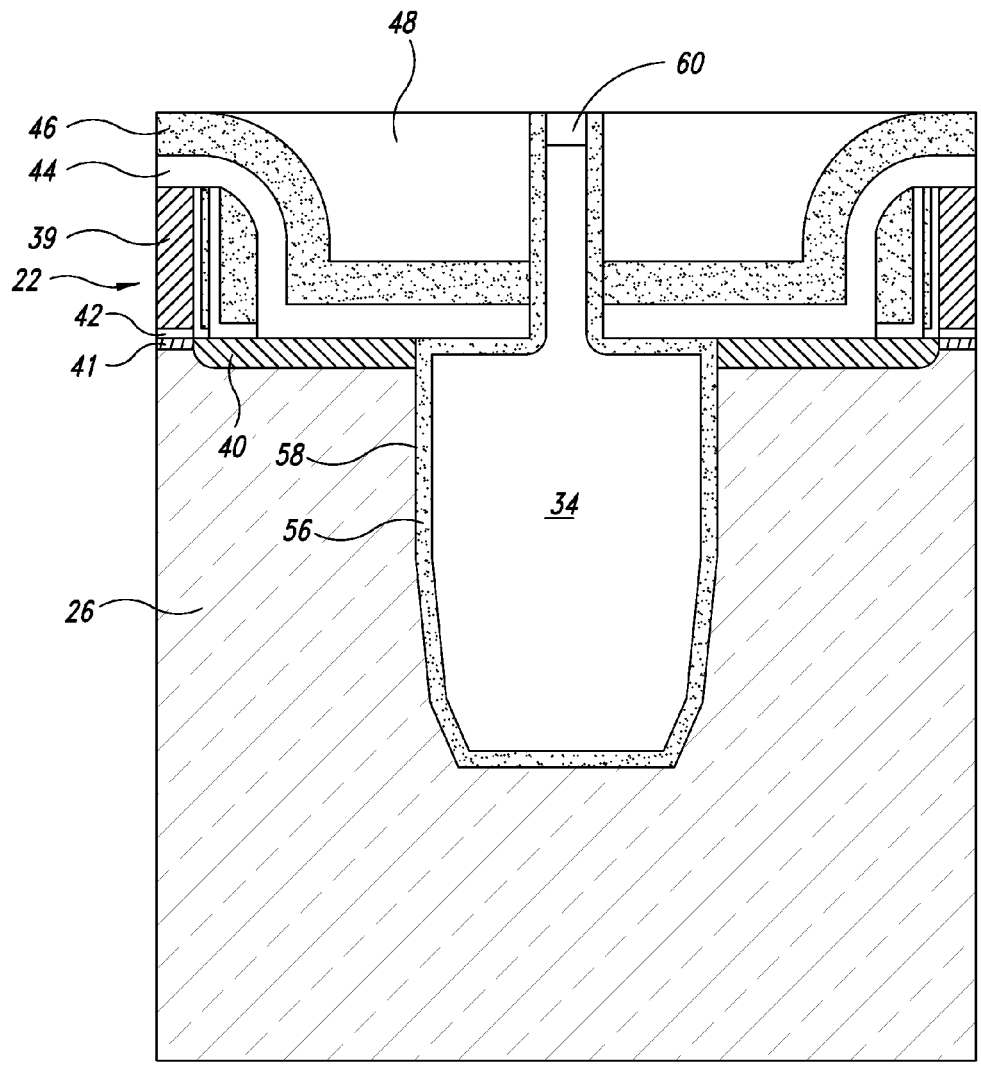

FIGS. 3A-3B illustrate a hollow trench 34 and strain inducing layer 56 according to one embodiment. In the embodiment of FIG. 3A, encapsulation layer 60 is a less conformal or non-conformal material that only partially fills opening 54 and does not fill hollow trench 34 at all. This allows for the hollow trench 34 to remain lower-k than if the encapsulation material 60 further lined the strain inducing layer inside the hollow trench 34. In FIG. 3B the encapsulation material 60 is removed above the third capping layers 48 by CMP or another suitable process, leaving a small plug 60 in the opening 54.

Figure 4:
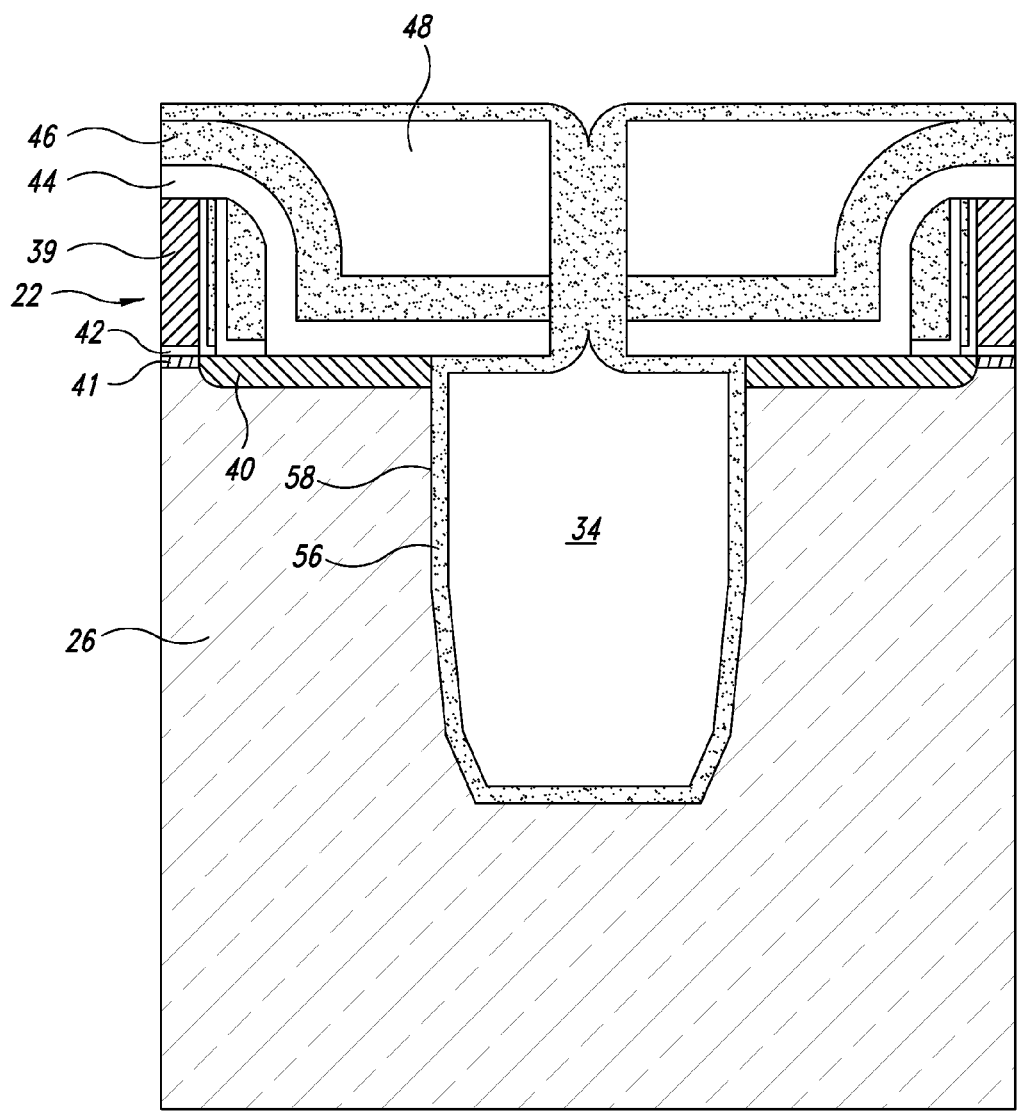
FIG. 4 is a cross section of an integrated circuit according to one embodiment.

FIG. 4 illustrates a hollow trench 34 and strain inducing layer 56 according to one embodiment of the invention. The strain inducing layer 56 is formed such that it thickens on the walls of the opening 54 during deposition until portions of the layer 56 on the walls of the opening 54 meet and completely fill the opening 54. When the opening 54 is plugged in this manner, the strain inducing layer ceases to grow on the sidewall 58 of the trench 34 because the material used to form the layer 56 no longer can enter the opening 54. The trench 34 is plugged and remains substantially hollow with the layer 56 on the sidewall 58. This eliminates the need for an encapsulation material to plug the opening 54. The strain inducing layer 56 can be grown, conformally deposited, or formed by any other procedure that plugs the opening 54, lines the trench 34 with a strain inducing layer 56, and leaves the trench 34 substantially hollow. In such an embodiment the width of the opening 54 is chosen to be approximately twice the desired width of the strain inducing layer 56. In this manner the opening 54 will be closed once the strain inducing layer 56 has reached the desired thickness.

Figure 5A:
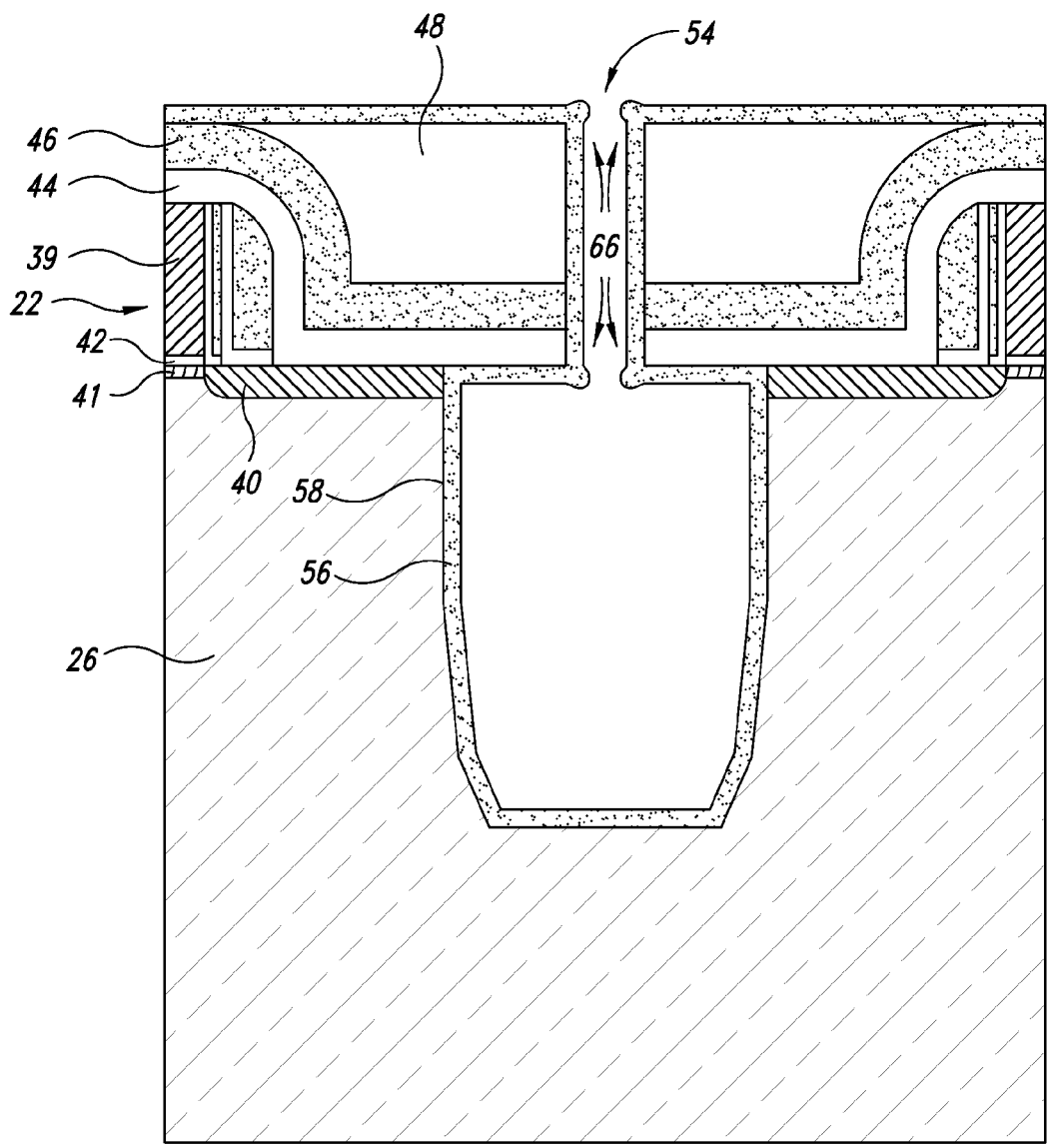
FIGS. 5A-5B are cross sections of an integrated circuit according to one embodiment.

FIG. 5A illustrates a phenomenon that may need to be taken into account when designing the dimensions of the opening 54 and the strain inducing layer 56. In some circumstances the phenomenon of "keyholing" occurs when conformally depositing a material. Keyholing is a phenomenon in which a deposited material forms thicker at corners on which it is deposited. As shown in FIG. 5A, the strain inducing layer 56 has grown disproportionately large at the corners 66 of opening 54. The layer 56 is much thicker at the corners 66 of the opening 54 than it is elsewhere. This can lead to potential problems in growing the layer 56 to the desired thickness on the wall 58 of trench 34.

Figure 5B:
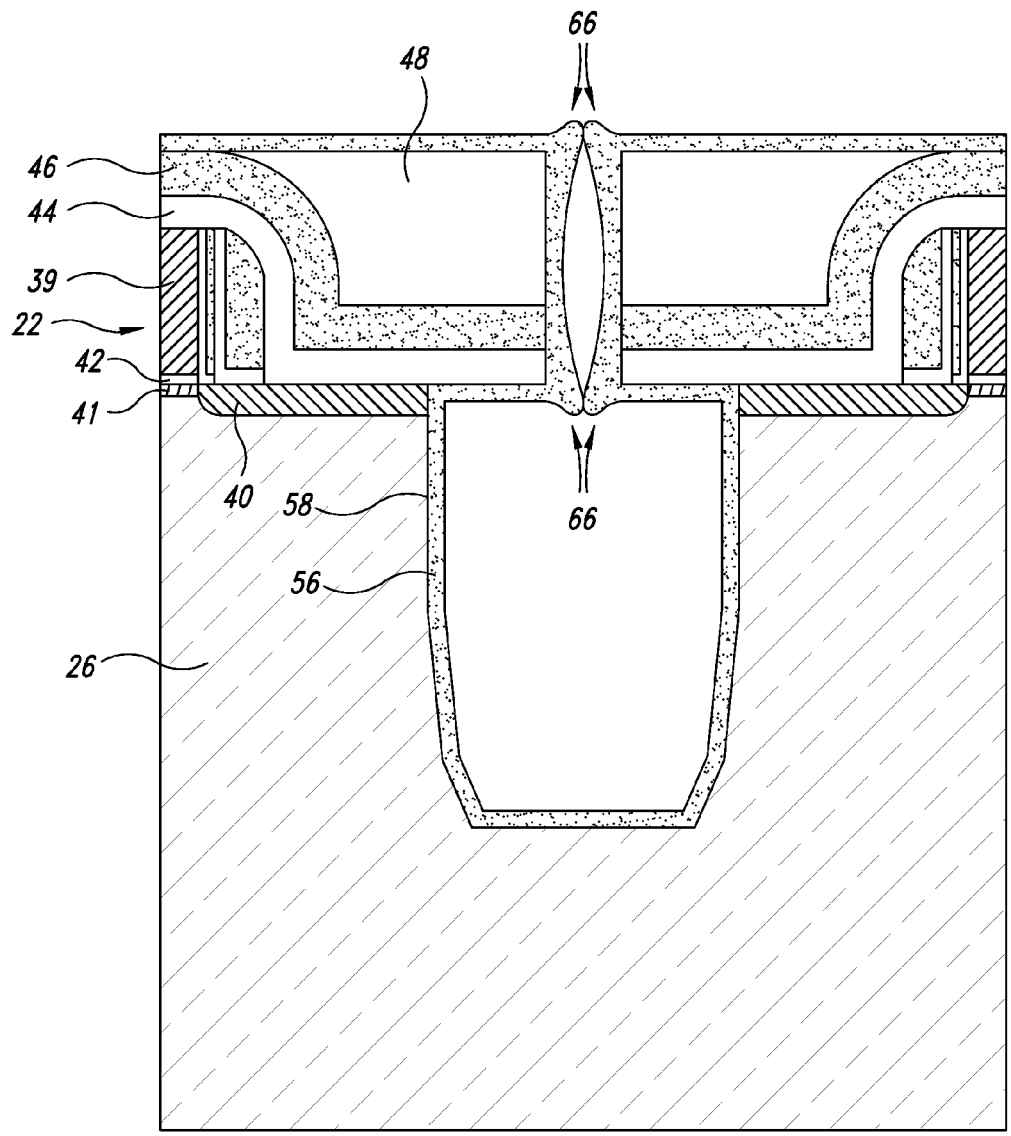

FIG. 5B illustrates a possible result of this keyholing. If the opening 54 is too narrow then it is possible that keyholing of the layer 56 at the corners 66 during deposition can cause the opening 54 to be entirely blocked before the strain inducing layer 56 has reached its desired thickness. The opening 54 can be designed to have a width selected to allow the strain inducing layer 56 to grow to its desired thickness before the opening 54 is closed. In this case the width of the opening 54 would be designed to be wider than twice the desired thickness of the strain inducing layer 56 on the sidewall 58 of trench 34, for example, three or four times wider. This ensures that the layer 56 will be fully and properly formed before access is cut off when the corners meet at points 66, as shown in FIG. 5B. The opening 54 can be designed to have a width appropriate for any scheme for depositing a strain inducing layer 56 and plugging the opening 54.

Figure 6A:
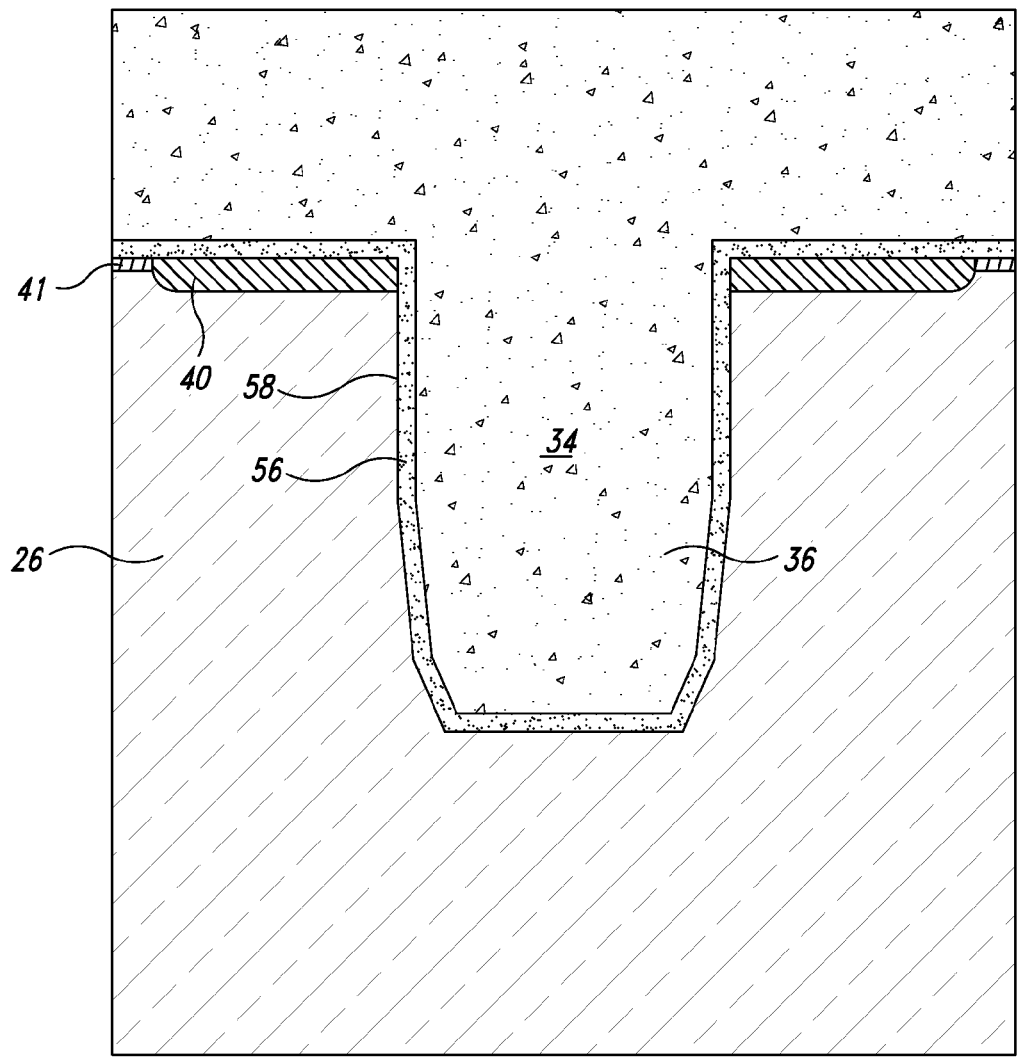
FIGS. 6A-6C are cross-sections of an integrated circuit according to one embodiment illustrating various steps of fabrication.
Figure 6B:
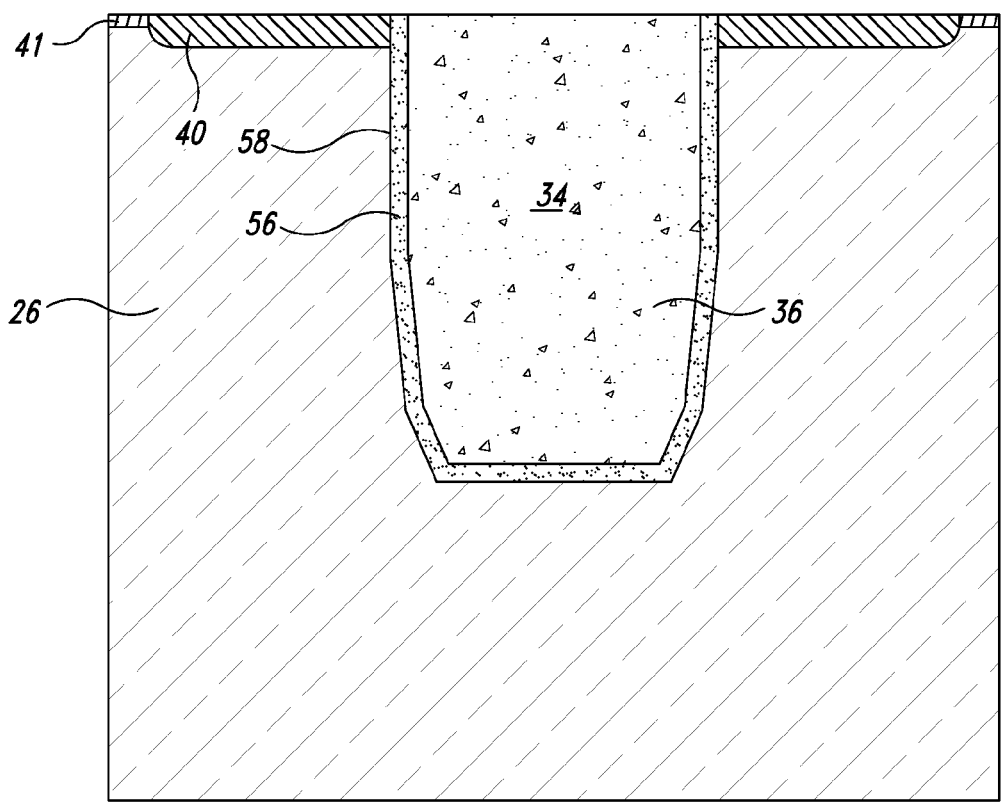
Figure 6C:
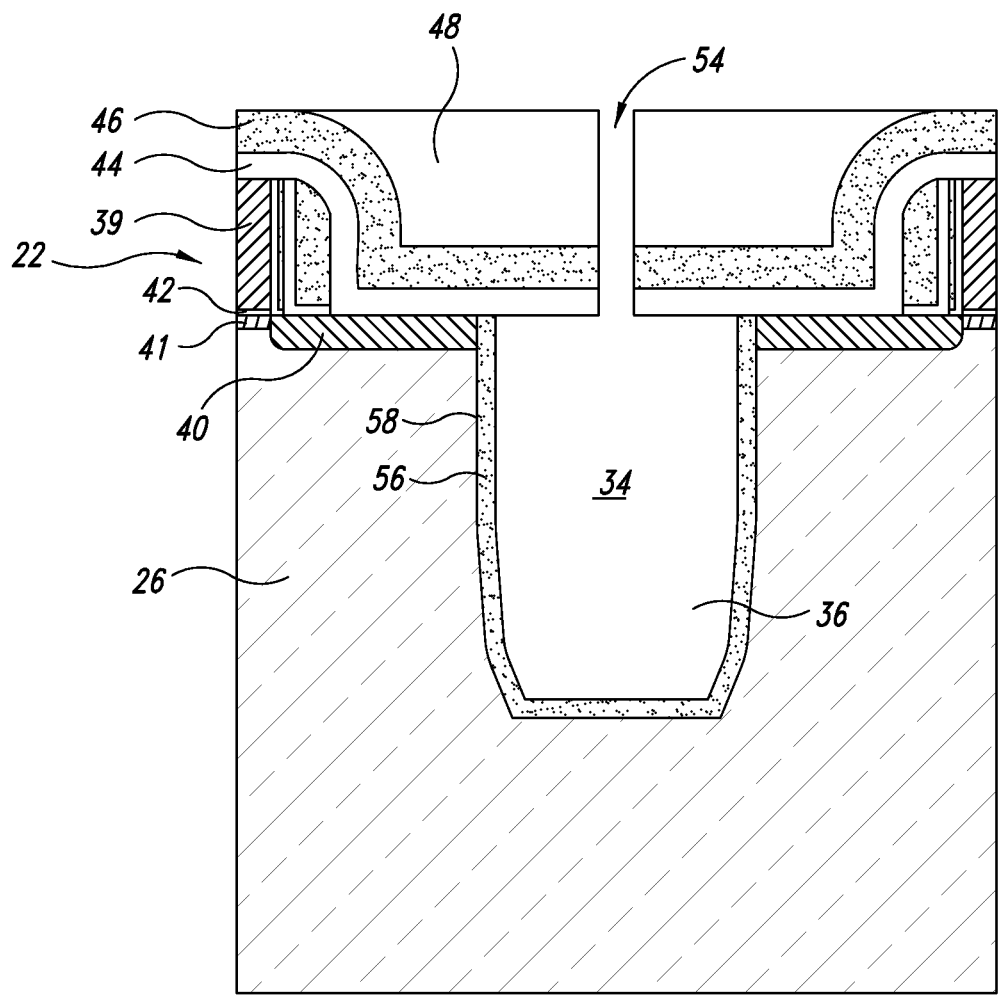

FIGS. 6A-6C illustrate a process for forming a strain inducing layer 56 according to one embodiment. In FIG. 6A substrate 26 is doped to form source/drain region 40 and channel region 41. The substrate 26 is then etched to form isolation trench 34 as previously described. A strain inducing layer 56 is then formed on the substrate 26 and on the sidewall 58 of trench 34. The strain inducing layer 56 is for example silicon nitride as described previously. The isolation trench is then filled with a fill material 36 as described previously. The fill material 36 is preferably selectively etchable with respect to the strain inducing layer 56. In one embodiment the strain inducing layer 56 is silicon nitride and the fill material 36 is SiGe as described previously.

In FIG. 6B CMP is performed to remove the strain inducing layer 56 and the fill material 34 above the substrate 26 and to make the upper surface of fill material 36 and strain inducing layer 56 substantially even with the surface of the substrate 26. The doping of source/drain region 40 and channel region 41 has been previously described as taking place prior to the etching of isolation trench 34. However, the doping of source/drain region 40 and channel region 41 may be performed subsequent to CMP of the fill material and strain inducing layer or at any other suitable time.

In FIG. 6C remaining portions of transistor 22 and sidewall spacer 43 are formed as described previously. Capping layers 44, 46, 48 are then formed as previously described. A opening 54 can now be formed with much narrower dimensions if desired because there is no worry about plugging the hole before layer 56 has reached its desired thickness. Opening 54 can be made as narrow as will still allow fill material 36 to be etched and removed as previously described. The opening 54 can be plugged with an encapsulation material as described previously or in any other suitable manner that leaves the trench 34 substantially hollow.

Figure 7:
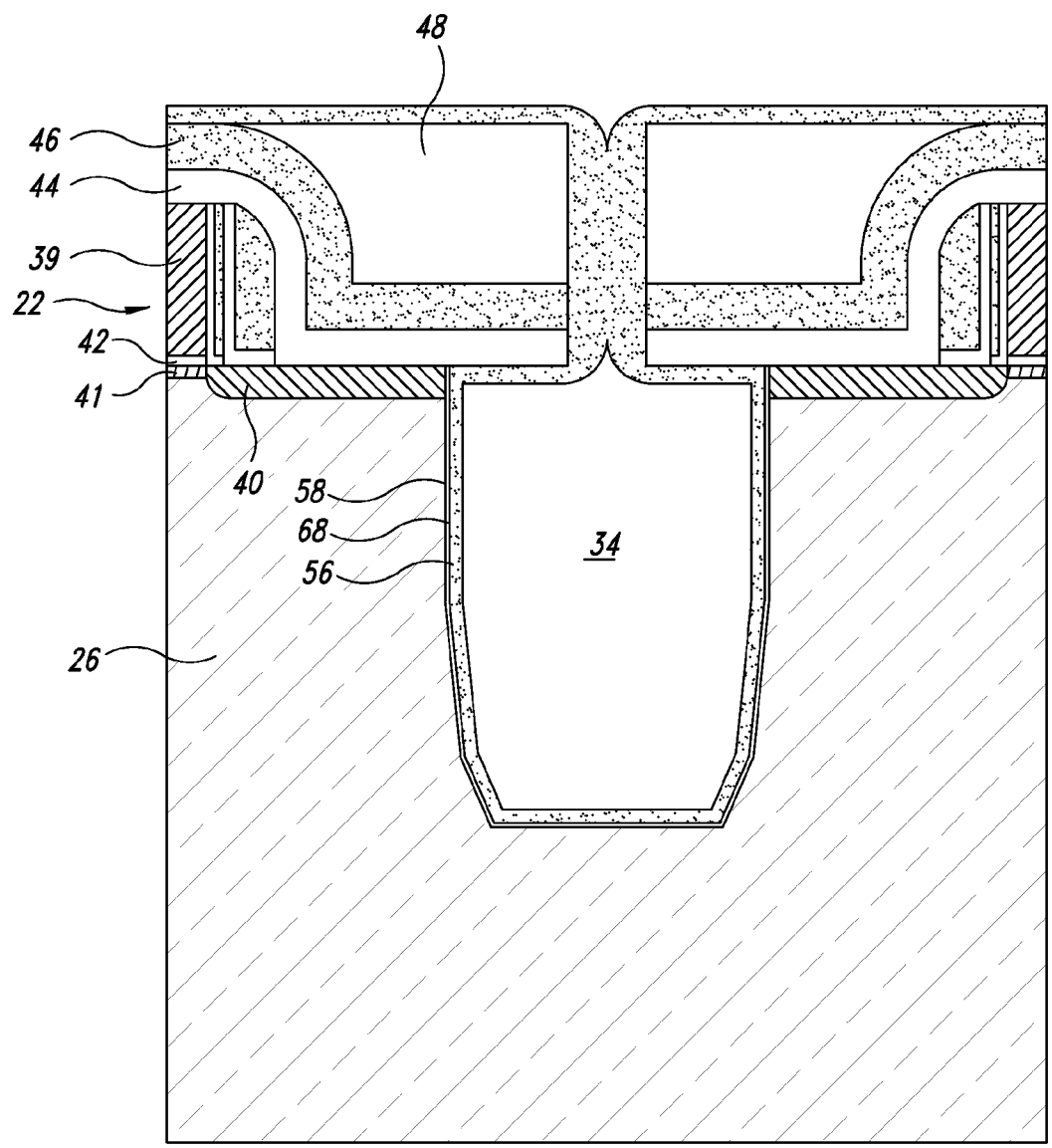
FIG. 7 is a cross section of an integrated circuit according to one embodiment.

FIG. 7 illustrates an isolation trench 34 according to one embodiment of the invention. Prior to forming strain inducing layer 56 on sidewall 58 of trench 34, a thin silicon oxide layer 68 is formed on sidewall 58. Strain inducing layer 56 is then formed on silicon oxide layer 68. The silicon oxide layer 68 can be very thin and serves to improve adhesion of the strain inducing layer 56 to the sidewall 58 of well 34. The silicon oxide layer 68 may be a native oxide layer allowed to grow under ambient conditions, or may be formed in any other suitable way. While the silicon oxide layer 68 has been shown only in FIG. 7, it can be present in other embodiments as well, including those described in relation to FIGS. 1-6. Furthermore, the layer 68 can be of a material other than silicon oxide. For example, in embodiments where the substrate 26 is other than silicon or the strain inducing layer 56 is other than silicon nitride, layer 68 may be an adhesion layer of any material that improves adhesion of the strain inducing layer 56 to sidewall 58 of trench 34.

A shallow trench isolation 34 has been described having improved characteristics. The shallow trench isolation 34 has a strain inducing layer 56 on the sidewall 58. The shallow trench isolation has also been left substantially hollow. In this way the shallow trench isolation 34 improves its isolating function while also enhancing carrier mobility in the channel region 41 of transistor 22.

The embodiments described above have been merely exemplary. They can be modified in many ways as will be apparent to those of skill in the art in light of the present disclosure, while not departing from the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. An integrated circuit, comprising:
   a semiconductor substrate;
   a transistor having a channel region in the semiconductor substrate;
   an isolation trench in the semiconductor substrate adjacent the transistor, the isolation trench being substantially hollow;
   a first strain inducing silicon nitride layer covering sidewalls of the isolation trench and positioned above a hollow portion of the isolation trench, the first strain inducing silicon nitride layer being configured to induce strain on the channel region of the transistor;

a silicon oxide layer covering the first strain inducing silicon nitride layer in the isolation trench and positioned between the first strain inducing silicon nitride layer and the hollow portion of the isolation trench; and a plug formed in an opening to the isolation trench, configured to seal the hollow portion of the isolation trench.

2. The integrated circuit of claim 1, wherein the first strain inducing silicon nitride layer is configured to induce a compressive strain in the channel region of a p-channel transistor.

3. The integrated circuit of claim 1, wherein the first strain inducing silicon nitride layer is configured to induce a tensile strain on the channel region of an n-channel transistor.

4. The integrated circuit of claim 1, comprising a second strain inducing layer above the transistor and configured to induce strain in the channel region of the transistor.

5. The integrated circuit of claim 1, wherein the transistor is a MOS transistor.

6. A method comprising:

forming a transistor at a surface of a semiconductor substrate;

forming an isolation trench in the semiconductor substrate adjacent the transistor;

forming a first strain inducing silicon nitride layer on a sidewall of the isolation trench and above a hollow portion of the isolation trench, the first strain inducing silicon nitride layer configured to induce strain on a channel region of the transistor;

forming a silicon oxide layer on the first strain inducing silicon nitride layer between the first strain inducing silicon nitride layer and the hollow portion of the isolation trench; and closing an opening to the isolation trench, the isolation trench remaining substantially hollow.

7. The method of claim 6, wherein forming the isolation trench comprises etching the semiconductor substrate.

8. The method of claim 7, wherein forming the first strain inducing layer comprises:

filling the isolation trench with a sacrificial material;

depositing a dielectric material over the isolation trench;

etching the opening to the isolation trench in the dielectric material above the isolation trench;

removing the sacrificial material through the opening;

depositing the silicon oxide layer on all sidewalls of the isolation trench; and depositing the first strain inducing silicon nitride layer on the silicon oxide layer through the opening.

9. The method of claim 6, comprising depositing the silicon nitride by PECVD.

10. The method of claim 9, comprising adjusting one or more deposition conditions of the silicon nitride to impart compressive or tensile strain in the silicon nitride.

11. The method of claim 6, comprising forming a second layer of strain inducing material over the transistor, the second layer of strain inducing material being configured to induce strain on the channel region of the transistor.

12. A device comprising:

a semiconductor substrate;

a transistor formed in the semiconductor substrate, the transistor having a channel region;

a substantially hollow isolation trench adjacent the transistor;

a first silicon nitride layer positioned on sidewalls of the substantially hollow isolation trench and above a hollow portion of the substantially hollow isolation trench, the first silicon nitride layer configured to impart strain to the channel region of the transistor; and a silicon oxide layer covering the first silicon nitride layer in the substantially hollow isolation trench and positioned between the first silicon nitride layer and the hollow portion of the substantially hollow isolation trench.

13. The device of claim 12, comprising a second silicon nitride layer above the transistor and configured to impart a strain to the channel region of the transistor.

14. The device of claim 13, wherein the first and second silicon nitride layers each impart a tensile strain to the channel region of the transistor.

* * * * *